United States Patent
Nawano

(10) Patent No.: US 8,714,713 B2
(45) Date of Patent: May 6, 2014

(54) LIQUID EJECTING HEAD, LIQUID EJECTING APPARATUS, AND PIEZOELECTRIC ELEMENT

(75) Inventor: Masahisa Nawano, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 86 days.

(21) Appl. No.: 13/323,673

(22) Filed: Dec. 12, 2011

(65) Prior Publication Data

US 2012/0147101 A1 Jun. 14, 2012

(30) Foreign Application Priority Data

Dec. 14, 2010 (JP) .................................. 2010-277760

(51) Int. Cl.
*B41J 2/015* (2006.01)
(52) U.S. Cl.
USPC .............................................................. 347/68
(58) Field of Classification Search
None
See application file for complete search history.

(56) References Cited

U.S. PATENT DOCUMENTS

| 7,141,915 | B2 * | 11/2006 | Takeuchi et al. | 310/328 |
| 2008/0203856 | A1 | 8/2008 | Miyazawa | |
| 2009/0201337 | A1 * | 8/2009 | Li | 347/44 |

FOREIGN PATENT DOCUMENTS

| DE | 102007046449 A1 * | 4/2009 |
| JP | 2008-211140 | 9/2008 |

* cited by examiner

*Primary Examiner* — Matthew Luu
*Assistant Examiner* — Erica Lin
(74) *Attorney, Agent, or Firm* — Workman Nydegger

(57) ABSTRACT

A piezoelectric element comprises a silicon oxide layer, an intermediate layer provided above the silicon oxide layer, a first electrode provided above the intermediate layer, a piezoelectric layer provided above the intermediate layer, and a second electrode provided above the piezoelectric layer. The piezoelectric layer is configured of a complex oxide having a perovskite structure and containing at least bismuth and iron. The intermediate layer contains magnesium oxide and/or aluminum oxide.

9 Claims, 6 Drawing Sheets

PIEZOELECTRIC LAYER
INTERMEDIATE LAYER
SILICON OXIDE LAYER

PIEZOELECTRIC LAYER
SILICON OXIDE LAYER

DETERIORATED LAYER

LIQUID EJECTING HEAD, LIQUID EJECTING APPARATUS, AND PIEZOELECTRIC ELEMENT

CROSS-REFERENCE TO RELATED APPLICATIONS

The entire disclosure of Japanese Patent Application No. 2010-277760, filed Dec. 14, 2010 is expressly incorporated by reference.

BACKGROUND

1. Technical Field

The present invention relates to a liquid ejecting head, a liquid ejecting apparatus, and a piezoelectric element.

2. Related Art

For example, liquid ejecting heads such as ink jet recording heads used in liquid ejecting apparatuses such as ink jet printers are known (see JP-A-2008-211140). As piezoelectric materials of piezoelectric elements provided to such liquid ejecting heads, PZT piezoelectric materials such as lead zirconate titanate (piezoelectric ceramics represented by a compositional formula, $Pb(Zr,Ti)O_3$, and abbreviated as "PZT") are known (see JP-A-2008-211140).

The strain amount of a piezoelectric ceramic having a less content of lead is generally smaller than those of PZT piezoelectric ceramics. However, recently, there is a demand for a piezoelectric material of a perovskite-type oxide having a less content of lead as an alternative material of the PZT piezoelectric materials, from the viewpoint of an environmental issue. For example, JP-A-2007-221066 discloses a lead-free piezoelectric material represented by a compositional formula, $Bi(Fe,Mn)O_3$, and abbreviated as BFO ceramics, containing bismuth as the A-site element and iron as the B-site element.

Accordingly, there is a demand for a liquid ejecting head including a piezoelectric element produced using a piezoelectric ceramic, wherein the liquid ejecting head has a low environmental load and an improved reliability.

SUMMARY

An advantage of some aspects of the invention is to provide a liquid ejecting head including a piezoelectric element having a low environmental load and an improved reliability. Another advantage of some aspects of the invention is to provide the piezoelectric element and a liquid ejecting apparatus including the liquid ejecting head.

(1) The liquid ejecting head according to an aspect of the invention includes a silicon oxide layer, an intermediate layer disposed on the silicon oxide layer, a first electrode disposed on the intermediate layer, a piezoelectric layer disposed on the intermediate layer, a second electrode disposed on the piezoelectric layer, and a pressure-generating chamber communicating with a nozzle hole, wherein the piezoelectric layer is configured of a complex oxide having a perovskite structure and containing at least bismuth and iron, and the intermediate layer contains magnesium oxide and/or aluminum oxide.

According to an aspect of the invention, a liquid ejecting head having a low environmental load and an improved reliability can be provided.

(2) In the liquid ejecting head according to an aspect of the invention, the piezoelectric layer may be disposed on the intermediate layer and the first electrode.

(3) In the liquid ejecting head according to an aspect of the invention, the complex oxide may further contain manganese and titanium as B-site elements.

(4) In the liquid ejecting head according to an aspect of the invention, the complex oxide may further contain potassium as an A-site element.

(5) The liquid ejecting apparatus according to an aspect of the invention includes the liquid ejecting head according to an aspect of the invention.

According to an aspect of the invention, a liquid ejecting apparatus including the liquid ejecting head having a low environmental load and an improved reliability can be provided.

(6) The piezoelectric element according to an aspect of the invention includes a silicon oxide layer, an intermediate layer disposed on the silicon oxide layer, a first electrode disposed on the intermediate layer, a piezoelectric layer disposed on the intermediate layer, and a second electrode disposed on the piezoelectric layer, wherein the piezoelectric layer is configured of a complex oxide having a perovskite structure and containing at least bismuth and iron, and the intermediate layer contains magnesium oxide and/or aluminum oxide.

According to an aspect of the invention, a piezoelectric element having a low environmental load and an improved reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENT

Figure 1:
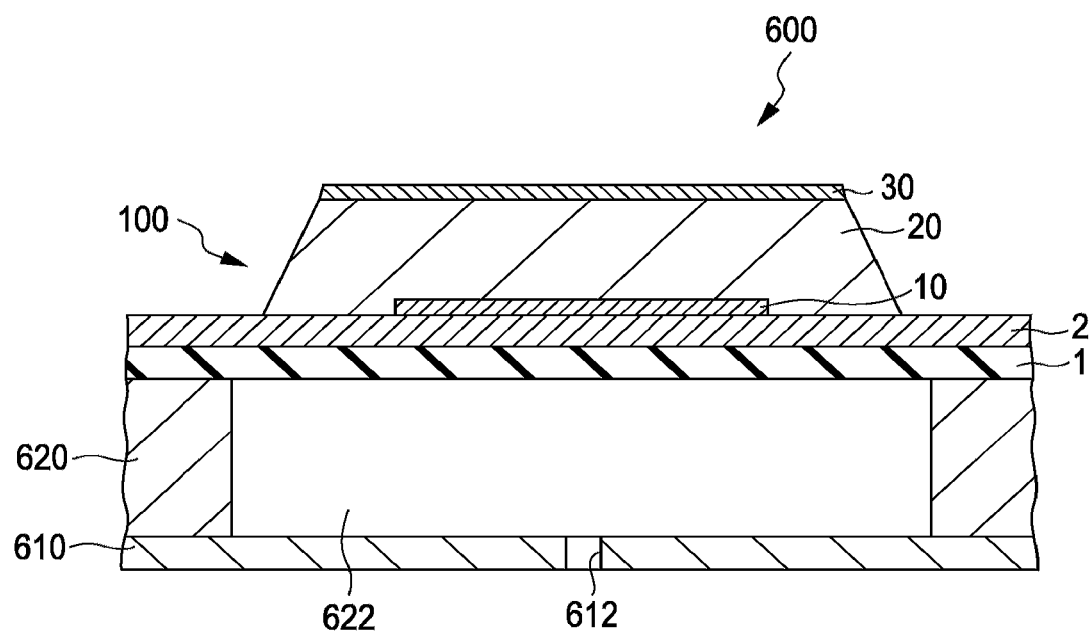
FIG. 1 is a cross-sectional view of a liquid ejecting head having a piezoelectric element according to an embodiment.

A preferred embodiment of the invention will be described with reference to the accompanying drawings.

A piezoelectric element provided to a liquid ejecting head according to this embodiment will be described first, and then the liquid ejecting head according to this embodiment will be described.

1. Piezoelectric Element

First, a piezoelectric element according to the embodiment will be described with reference to the drawing.

FIG. 1 is a cross-sectional view schematically illustrating a piezoelectric element 100 and a liquid ejecting head 600 according to the embodiment.

As shown in FIG. 1, the piezoelectric element 100 includes a silicon oxide layer 1, an intermediate layer 2 disposed on the silicon oxide layer 1, a first electrode 10 disposed on the intermediate layer 2, a piezoelectric layer 20 disposed on the intermediate layer 2 so as to cover the first electrode 10, and a second electrode 30 disposed on the piezoelectric layer 20.

As shown in FIG. 1, the silicon oxide layer 1 is a part of the substrate of the piezoelectric element 100 and is plate-like member. The shape of the silicon oxide layer 1 is, for example, a layer-like or a thin film-like. The thickness of the silicon oxide layer 1 is, for example, 10 nm or more and 100 nm or less. The silicon oxide layer 1 may have any shape having a flat upper surface and may be a rectangle or a circle. The silicon oxide layer 1 has flexibility and can be deformed (bend) by movement of the piezoelectric layer 20.

As shown in FIG. 1, the intermediate layer 2 is disposed between the silicon oxide layer 1 and the first electrode 10. The intermediate layer 2 is a part of the substrate of the piezoelectric element 100 and a plate-like member. The shape of the intermediate layer 2 is, for example, a layer-like or a thin film-like. The thickness of the intermediate layer 2 is, for example, 10 nm or more and 100 nm or less. The intermediate layer 2 may have any shape having a flat upper surface and may be a rectangle or a circle. The intermediate layer 2 has flexibility and can be deformed (bend) by movement of the piezoelectric layer 20.

The material of the intermediate layer 2 is magnesium oxide and/or aluminum oxide. Accordingly, intermediate layer 2 may be a monolayer of magnesium oxide or aluminum oxide as shown in FIG. 1 or may be a laminate of magnesium oxide and aluminum oxide (not shown).

The use of aluminum oxide in the intermediate layer 2 can provide higher rigidity, which can contribute to reductions in size and thickness of the piezoelectric element 100. In addition, the use of aluminum oxide in the intermediate layer 2 can reduce the manufacturing cost, which can contribute to an improvement in productivity.

Furthermore, the use of magnesium oxide in the intermediate layer 2 can prevent cracking from occurring during the manufacturing process. In addition, the adhesion with the silicon oxide layer 1 is enhanced. Consequently, the reliability of the piezoelectric element 100 can be further improved.

The first electrode 10 is disposed on the intermediate layer 2. The shape of the first electrode 10 is, for example, a layer-like or a thin film-like. The thickness of the first electrode 10 is, for example, 50 nm or more and 400 nm or less. The first electrode 10 may have any planar shape that allows the piezoelectric layer 20 to be arranged between the first electrode 10 and the second electrode 30 being arranged so as to be opposite to the first electrode 10 and may have a planar shape of, for example, a rectangle or a circle.

Examples of the material of the first electrode 10 include various metals such as nickel, iridium, and platinum; electrically conductive oxides of the metals (e.g., iridium oxide); and complex oxides of strontium and ruthenium ($SrRuO_x$: SRO) and complex oxides of lanthanum and nickel ($LaNiO_x$: LNG). The first electrode 10 may has a monolayer structure of the material mentioned above or a laminate structure of a plurality of the materials mentioned above.

One of the functions of the first electrode 10 is to make a pair with the second electrode 30 and serves as one electrode for applying a voltage to the piezoelectric layer 20 (e.g., serving as a lower electrode disposed below the piezoelectric layer 20).

Furthermore, a layer (not shown) may be disposed between the first electrode 10 and the intermediate layer 2 for, for example, providing adhesion therebetween or providing strength or electrical conductivity. Examples of such a layer include layers of various metals, such as titanium, nickel, iridium, and platinum, and oxides thereof.

The piezoelectric layer 20 is disposed on the intermediate layer 2. The piezoelectric layer 20 may be disposed on the first electrode 10 and the intermediate layer 2. Accordingly, the piezoelectric layer 20 may be disposed on the intermediate layer 2 so as to cover the first electrode 10. Alternatively, the piezoelectric layer 20 may be disposed only on the first electrode 10 (not shown). The shape of the piezoelectric layer 20 is, for example, a layer-like or a thin film-like. The thickness of the piezoelectric layer 20 is, for example, 300 nm or more and 1000 nm or less. The piezoelectric layer 20 can have piezoelectricity and can be deformed by being applied with an electric field by the first electrode 10 and the second electrode 30 (electromechanical transduction).

The material of the piezoelectric layer 20 contains a complex oxide having a perovskite-type crystal structure as a main component. That is, the piezoelectric layer 20 may contain inevitable impurities in the manufacturing process. The complex oxide is represented by a general formula $ABO_3$, where the standard ratio of the total number of moles of the elements on the A-site, the total number of moles of the elements on the B-site, and the number of moles of oxygen atoms is 1:1:3, but the ratio may be deviate from 1:1:3 within a range that gives a perovskite structure.

The complex oxide of the piezoelectric element according to the embodiment has a perovskite structure and contains bismuth (Bi) as an A-site element and iron (Fe) as a B-site element. Examples of such a complex oxide include solid solutions including ceramics (mixed crystal ceramics) represented by a compositional formula, $Bi(Fe,Mn)O_3$, and abbreviated as BFO ceramics.

Furthermore, the complex oxide of the piezoelectric element according to the embodiment may further contain manganese (Mn) and titanium (Ti) as B-site elements. Examples of such a complex oxide include solid solutions including ceramics (mixed crystal ceramics) represented by a compositional formula, $xBi(Fe,Mn)O_3$-$yBaTiO_3$ (wherein, x+y=1), and abbreviated as BFM-BT ceramics.

Furthermore, the complex oxide of the piezoelectric element according to the embodiment may further contain potassium (K) as an A-site element. Examples of such a complex oxide include solid solutions including ceramics (mixed crystal ceramics) represented by a compositional formula, $xBi(Fe,Mn)O_3$-$y(Bi,K)TiO_3$ (wherein, x+y=1), and abbreviated as BFM-BKT ceramics.

It is known that the characteristics of piezoelectric materials can be improved by adding various elements, such as manganese, chromium, cobalt, aluminum, potassium, lithium, magnesium, calcium, strontium, vanadium, niobium, tantalum, molybdenum, tungsten, nickel, zinc, silicon, lanthanum, cerium, praseodymium, promethium, samarium, and europium, to the materials. The piezoelectric layer 20 may further contain these additives within ranges that provide the effects of the invention.

The second electrode 30 is disposed on the piezoelectric layer 20. The shape of the second electrode 30 is, for example, a layer-like or a thin film-like. The thickness of the second electrode 30 is, for example, 50 nm or more and 400 nm or less. The shape of the second electrode 30 is not particular limited and is, for example, a rectangle or a circle. The material of the second electrode 30 may be those mentioned as the materials of the first electrode 10.

One of the functions of the second electrode 30 is to make a pair with the first electrode 10 and serves as one electrode for applying a voltage to the piezoelectric layer (e.g., serving as a upper electrode disposed above the piezoelectric layer 20).

In the example shown in the drawing, the second electrode 30 is disposed on the upper surface of the piezoelectric layer 20, but may be further disposed on the side surfaces of the piezoelectric layer 20 and the upper surface of the intermediate layer 2.

The piezoelectric element 100 as described above may be applied to, for example, a liquid ejecting head or a liquid ejecting apparatus (ink jet printer) using the liquid ejecting head as a piezoelectric actuator for pressurizing a liquid in a pressure-generating chamber or may be used as, for example, a piezoelectric sensor for detecting deformation of a piezoelectric layer as an electrical signal.

The piezoelectric element according to the embodiment has the following characteristics, for example.

In the piezoelectric element according to the embodiment, an intermediate layer 2 composed of magnesium oxide and/or aluminum oxide is disposed between a piezoelectric layer 20 containing bismuth and a silicon oxide layer 1. Bismuth, an alkali element, tends to diffuse to the peripheral members during and after the manufacturing process. For example, it is known that bismuth easily diffuses through even a metal layer such as a platinum layer. The diffused bismuth is highly reactive and therefore possibly deteriorates the peripheral members. For example, it is known that silicon oxide is deteriorated by diffused bismuth to form bismuth silicate. However, in the piezoelectric element according to the embodiment, diffusion of bismuth from the piezoelectric layer 20 can be prevented by the intermediate layer 2, which protects the silicon oxide layer 1 disposed under the intermediate layer 2. That is, in a piezoelectric element using the piezoelectric layer 20 containing bismuth, it is possible to prevent a reduction in reliability of the piezoelectric element due to deterioration of the surface of the silicon oxide layer 1. Accordingly, a piezoelectric element having an improved reliability can be provided.

In addition, even in the case of a piezoelectric layer 20 containing an alkali element in addition to bismuth, such as potassium, the silicon oxide layer 1 can be protected by the effect of the intermediate layer 2 to provide a piezoelectric element having an improved reliability.

Furthermore, in the piezoelectric element according to the embodiment, the intermediate layer 2 disposed between the silicon oxide layer 1 and the first electrode 10/the piezoelectric layer 20 can certainly prevent process damage during the manufacturing process. Accordingly, a piezoelectric element having an improved reliability can be provided. The details will be described below.

2. Liquid Ejecting Head

Figure 2:
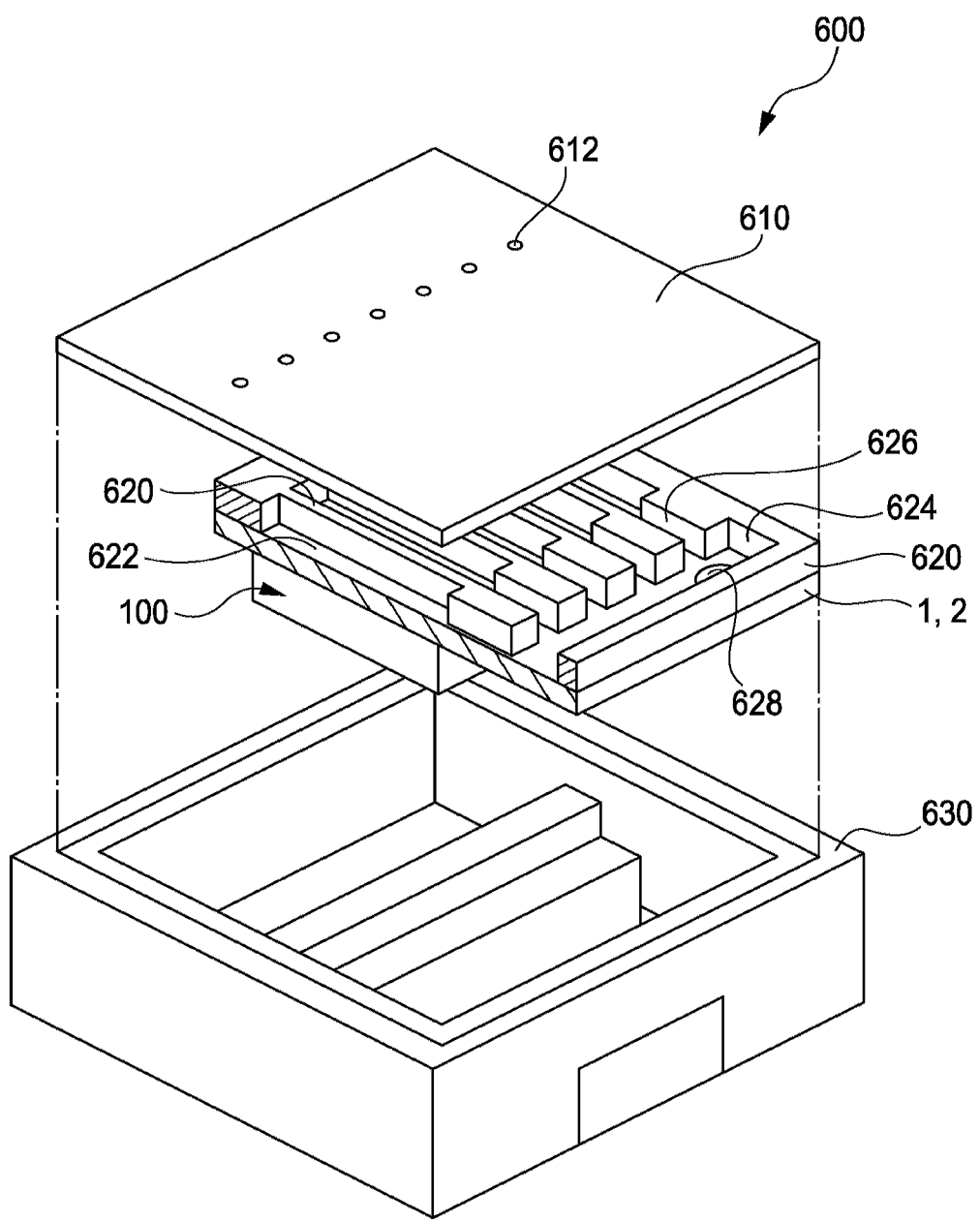
FIG. 2 is an exploded perspective view of schematically illustrating the liquid ejecting head according to the embodiment.

Next, the liquid ejecting head according to this embodiment will be described with reference to the drawings. FIG. 1 is a cross-sectional view schematically illustrating the main portion of the liquid ejecting head 600. FIG. 2 is an exploded perspective view of the liquid ejecting head 600, showing the liquid ejecting head 600 upside down from its usual using state.

The liquid ejecting head 600 includes piezoelectric elements according to an aspect of the invention. An example using the piezoelectric element 100 as a piezoelectric element according to an aspect of the invention will be described below.

As shown in FIGS. 1 and 2, the liquid ejecting head 600 includes, for example, a nozzle plate 610, a passage-forming substrate 620, piezoelectric elements 100, and a housing 630.

In FIG. 2, the piezoelectric elements 100, the silicon oxide layer 1, and the intermediate layer 2 are shown in simplified forms.

As shown FIGS. 1 and 2, the nozzle plate 610 has a nozzle hole 612 through which ink is discharged. The nozzle plate 610 is provided with, for example, a plurality of nozzle holes 612. In the example shown in FIG. 2, a plurality of nozzle holes 612 is aligned in a line. Examples of the material of the nozzle plate 610 include silicon and stainless steel (SUS).

The passage-forming substrate 620 (the lower side in FIG. 2) is disposed on the nozzle plate 610. Examples of the material of the passage-forming substrate 620 include silicon. As shown in FIG. 2, a reservoir (liquid reserving portion) 624, feeding apertures 626 communicating with the reservoir 624, and pressure-generating chambers 622 communicating with the feeding apertures 626 are provided by partitioning the space between the nozzle plate 610 and the silicon oxide layer 1 by the passage-forming substrate 620. In this example, the reservoir 624, the feeding apertures 626, and the pressure-generating chambers 622 are separately described, but they are all channels for a liquid (e.g., also referred to as manifold), and these channels may be designed in any shapes. For example, the feeding apertures 626 in the example shown in the drawing each have a shape in which part of the channel is narrowed, but they may be appropriately shaped according to design, and the structure of the example is not essential.

The reservoir 624 can temporally reserve ink that is supplied from the outside (e.g., an ink cartridge) through a via-hole 628 provided in the silicon oxide layer 1 and the intermediate layer 2. The ink in the reservoir 624 can be supplied to the pressure-generating chambers 622 through the feeding apertures 626. The volumes of the pressure-generating chambers 622 are changed by deformation of the silicon oxide layer 1 and the intermediate layer 2. The pressure-generating chambers 622 communicate with the nozzle holes 612, and ink or the like is discharged from the nozzle holes 612 by the change in the volumes of the pressure-generating chambers 622.

The reservoir 624 and the feeding apertures 626 may be provided to a member (not shown) other than the passage-forming substrate 620 as long as they communicate with the pressure-generating chambers 622.

The piezoelectric element 100 (the lower side in FIG. 2) is disposed on the passage-forming substrate 620. The piezoelectric element 100 is electrically connected to a piezoelectric element driving circuit (not shown) and can be operated (vibrated or deformed) based on a signal from the piezoelectric element driving circuit. The silicon oxide layer 1 and the intermediate layer 2 are deformed by movement of the piezoelectric layer 20 to appropriately change the inner pressure of the pressure-generating chamber 622.

As shown in FIG. 2, the housing 630 can receive the nozzle plate 610, the passage-forming substrate 620, and the piezoelectric elements 100. Examples of the material of the housing 630 include resins and metals.

The liquid ejecting head 600 can include a piezoelectric element 100 having a low environmental load and an improved reliability. Accordingly, a liquid ejecting head 600 having a low environmental load and an improved reliability can be provided.

In the above-mentioned example, a liquid ejecting head 600 where the volume of the pressure-generating chamber 622 is changed by flexure vibration using the piezoelectric element 100 having a piezoelectric layer 20 disposed between two electrodes 10 and 30 has been described. However, the liquid ejecting head according to the invention is not limited to the above-mentioned configuration. For example, the liquid ejecting head may have a configuration in which a piezoelectric element composed of alternately laminated piezoelectric layers and electrodes is fixed on a substrate for fixation and the volume of a pressure-generating chamber is changed by longitudinal vibration. Furthermore, the liquid ejecting head according to an aspect of the invention may use a so-called shear-mode piezoelectric element where the volume of a pressure-generating chamber is changed by shear deformation not by expansion or contraction deformation of the piezoelectric element.

In the above-mentioned example, an ink jet recording head has been described as an example of the liquid ejecting head 600, but the liquid ejecting head according to the embodiment can be used as, for example, a coloring material ejecting head used for producing color filters of, for example, liquid crystal displays, an electrode material ejecting head used for forming electrodes of, for example, organic EL displays or field emission displays (FEDs), or a bio-organic material ejecting head used for producing bio-chips.

3. Method of Producing Piezoelectric Element and Liquid Ejecting Head

Next, a method of producing the piezoelectric element and the liquid ejecting head according to this embodiment will be described with reference to the drawings.

FIGS. 3A to 3D are cross-sectional views for schematically illustrating a process of producing the piezoelectric element and the liquid ejecting head according to the embodiment.

Figure 3A:
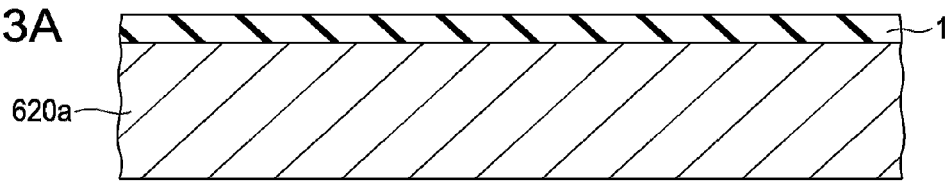
FIGS. 3A to 3D are cross-sectional views schematically illustrating the liquid ejecting head in its production process according to the embodiment.

As shown in FIG. 3A, a substrate 620a of a single crystal silicon substrate is prepared, and a silicon oxide layer 1 is formed on the substrate 620a on a surface on which a piezoelectric element 100 is formed. The method for forming the silicon oxide layer 1 is not particularly limited, and a known film-forming technology can be used. For example, the silicon oxide layer 1 is formed by thermal oxidation.

Figure 3B:
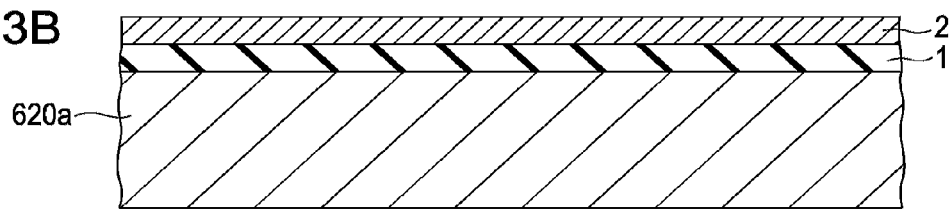

Then, as shown in FIG. 3B, an intermediate layer 2 is formed on the silicon oxide layer 1. The method of forming the intermediate layer 2 is not particularly limited, and a known film-forming technology can be used. For example, the intermediate layer 2 is formed by a known film-forming method such as spin coating, sputtering, vacuum deposition, or metal organic chemical vapor deposition (MOCVD). In the process of forming the intermediate layer 2, a drying step, a degreasing step, a heat treatment step for crystallization, and a patterning step may be optionally performed.

Figure 3C:
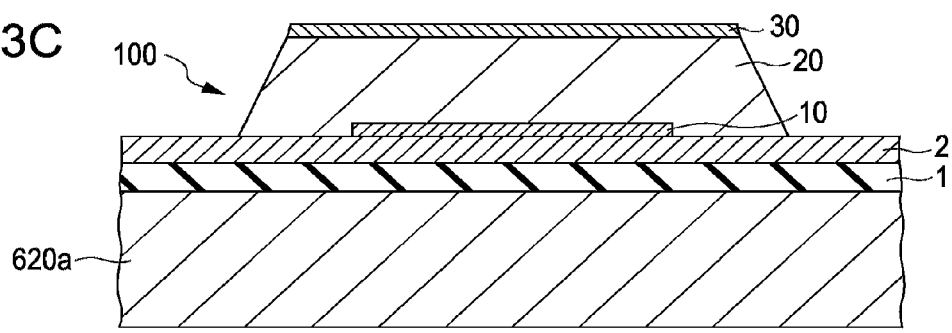

Then, as shown in FIG. 3C, a first electrode 10, a piezoelectric layer 20, and a second electrode 30 are laminated on the intermediate layer 2. Here, the method of forming each layer and the order of patterning these layers are not particularly limited.

As shown in FIG. 3C, the first electrode 10 is formed on the intermediate layer 2. The method of producing the first electrode 10 is not particularly limited, and a known film-forming method can be used. For example, a first electrically conductive layer 11 and a second electrically conductive layer 12 are formed by known film-forming methods such as spin coating, sputtering, vacuum deposition, or metal organic chemical vapor deposition (MOCVD). In the process of forming the first electrode 10, a drying step, a degreasing step, a heat treatment step for crystallization, and a patterning step may be optionally performed.

Then, the piezoelectric layer 20 is formed on the first electrode 10. The piezoelectric layer 20 is formed by a liquid-phase method represented by, for example, sputtering, laser ablation, MOCVD, a sol-gel method, or metal organic deposition (MOD). The crystallization temperature of the piezoelectric layer 20 is, for example, 500° C. or more and 800° C. or less. In the process of forming the piezoelectric layer 20, a drying step, a degreasing step, a heat treatment step for crystallization, and a patterning step may be optionally performed.

Then, a second electrode 30 is formed on the piezoelectric layer 20. The second electrode 30 is formed by, for example, sputtering, vacuum deposition, or MOCVD. In the process of forming the second electrode 30, a drying step, a degreasing step, a heat treatment step for crystallization, and a patterning step may be optionally performed. The patterning of the second electrode 30 and the piezoelectric layer 20 may be performed in the same step or may be separately performed.

As described above, the crystallization of the piezoelectric layer 20 containing bismuth is performed above the intermediate layer 2. Consequently, the intermediate layer 2 can protect the silicon oxide layer 1 from the influence of diffusion of bismuth.

By the process described above, a piezoelectric element 100 having a low environmental load and an improved reliability can be produced.

Figure 3D:
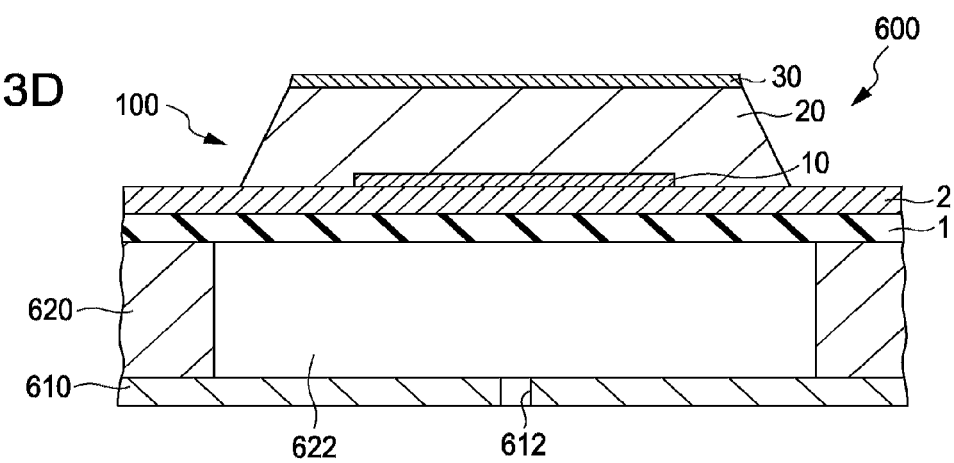

Then, as shown in FIG. 3D, the substrate 620a is shaped to form a passage-forming plate 620. The shaping process may appropriately include a step of grinding the back surface (surface on the opposite side of the surface on which the piezoelectric element 100 is disposed) of the substrate 620a, an etching step, or a dicing step. In the etching step, for example, a passage such as the pressure-generating chamber 622 can be formed in the passage-forming plate 620 by wet etching utilizing an etchant such as KOH.

Herein, the silicon oxide layer 1 is also used as an etching stopper. Since the silicon oxide layer 1 is protected by the intermediate layer 2 from the deterioration effect of the piezoelectric layer 20 containing bismuth, the silicon oxide layer 1 can certainly function as an etching stopper. Consequently, the piezoelectric element 100 can be certainly protected from process damage.

Then, a nozzle plate 610 having nozzle holes 612 is joined to a predetermined position with, for example, an adhesive. By doing so, the nozzle holes 612 communicate with the pressure-generating chambers 622. Furthermore, a sealing plate 630 (not shown) is mounted on the liquid ejecting head from the upper side of the piezoelectric element 100.

The liquid ejecting head 600 can be produced by any of the above-described methods. The method of producing the liquid ejecting head 600 is not limited to the above-described methods, and the passage-forming plate 620 and the nozzle plate 610 may be formed in a unified manner by electroforming.

4. EXAMPLES

The invention will be more specifically described with the following Examples 1 and 2 and Comparative Example 1 with reference to the drawings, but the invention is not limited to the following examples.

4.1. Example 1

First, a substrate was produced by the following process. A silicon dioxide layer (silicon oxide layer) was produced by thermal oxidation of a single crystal silicon substrate. A magnesium oxide layer (intermediate layer) having a thickness of 50 nm was produced by spin coating on this silicon dioxide layer. The substrate was rotated at 500 rpm for 5 sec and then at 3000 rpm for 30 sec. The raw material solution for the magnesium oxide layer was prepared by mixing an organometallic salt containing magnesium oxide with a solvent (n-butanol).

Then, a piezoelectric layer was formed by a liquid-phase method on the magnesium oxide layer (intermediate layer). The method is as follows.

First, a raw material solution for the above-mentioned piezoelectric layer was prepared. This raw material solution was dropped onto the first electrode by spin coating, and the substrate was rotated (application step). The substrate was rotated at 500 rpm for 10 sec and then at 3000 rpm for 30 sec. The raw material was prepared by mixing a known metal alkoxide or organic acid metal salt containing bismuth, iron, manganese, titanium, and potassium with a solvent (n-butanol).

Then, the substrate was placed on a hot plate set to 150° C. and was dried for 3 min (drying step) and then was placed and held on a hot plate set to 450° C. for 6 min (degreasing step). These application step, drying step, and degreasing step were repeated three times. Then, annealing was performed at 750° C. for 5 min in an oxygen atmosphere (crystallization step) to form a piezoelectric layer of a thin film (film-forming process). The film-forming process was repeated twice. By doing so, a piezoelectric layer composed of a complex oxide represented by the following general formula (1):

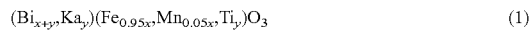

$$(Bi_{x+y}, Ka_y)(Fe_{0.95x}, Mn_{0.05x}, Ti_y)O_3 \quad (1)$$

and satisfying x=0.6 and y=1-x=0.4 was obtained. The thickness of the piezoelectric layer was 600 nm.

4.2. Example 2

In Example 2, a sample was produced as in Example 1 except that an aluminum oxide layer (intermediate layer) having a thickness of 50 nm was produced by vacuum deposition on the silicon dioxide layer, wherein the deposition was performed for 2 min under conditions of a degree of vacuum of $(1.0 \times 10^{-5})$ Pa, a machining temperature of 120° C., and machining rate of 50 nm/min.

4.3. Comparative Example 1

In Comparative Example 1, a sample was produced as in Example 1 except that a piezoelectric layer was produced on the silicon oxide layer without producing the intermediate layer.

4.4. Evaluation of X-Ray Diffraction

Analysis of X-ray diffraction pattern was performed using "D8 Discover" manufactured by Bruker AXS.

Figure 4:
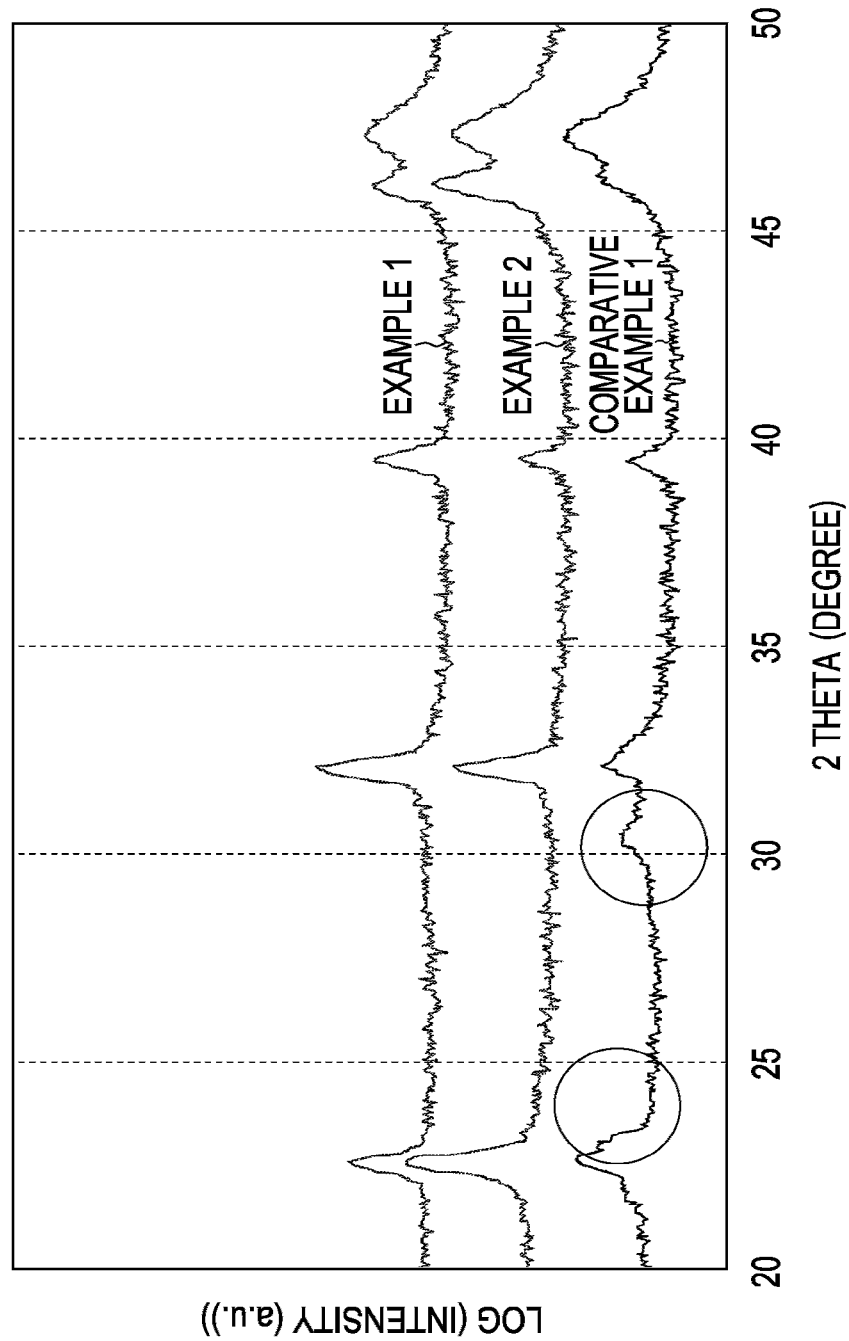
FIG. 4 shows X-ray diffraction patterns obtained in Examples 1 and 2 and Comparative Example 1.

FIG. 4 shows the results of X-ray diffraction pattern analysis in Examples 1 and 2 and Comparative Example 1. In the results of X-ray diffraction pattern analysis shown in FIG. 4, a heterophase peak derived from bismuth oxide was observed at about 30° in only Comparative Example 1. In Examples 1 and 2, such a heterophase was not observed. Accordingly, it was confirmed that bismuth did not diffuse to the silicon oxide layer by disposing the intermediate layer.

Figure 5A:
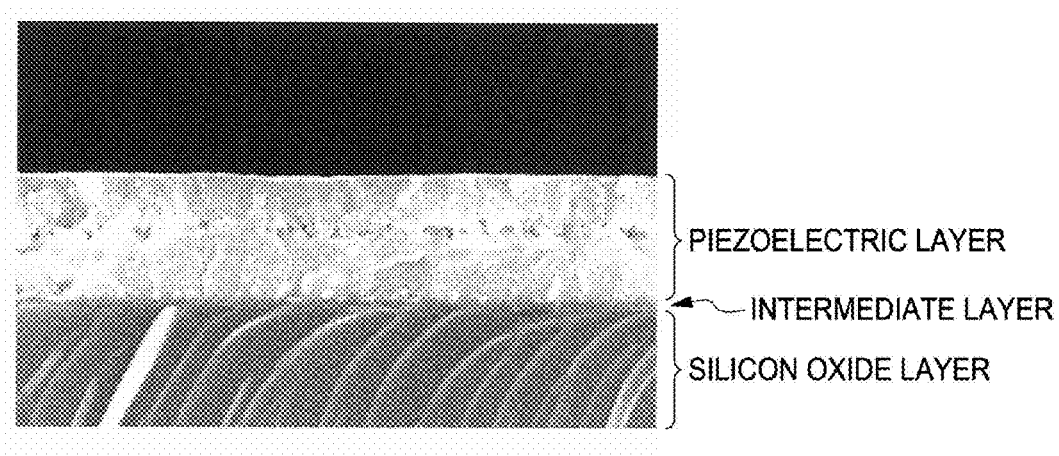
FIG. 5A is an SEM image obtained in Example 1.
Figure 5B:
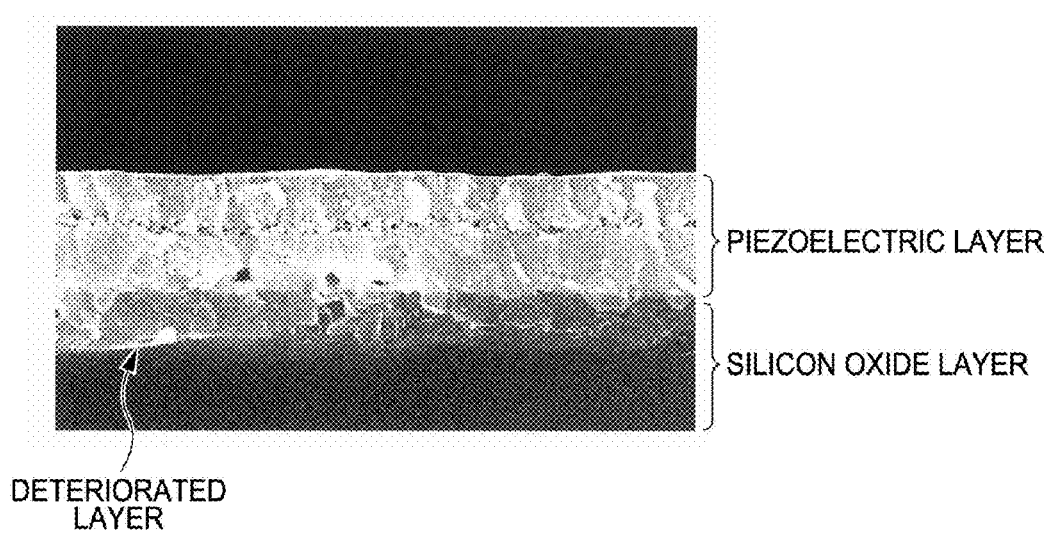
FIG. 5B is an SEM image obtained in Comparative Example 1.

4.5. Cross-Section States (SEM Images) of Piezoelectric Layer and Silicon Oxide Layer FIG. 5A is an SEM image in Example 1 and showing the cross-sectional states of the silicon oxide layer, the intermediate layer, and the piezoelectric layer of the sample according to Example 1. FIG. 5B is an SEM image in Comparative Example 1 and showing the cross-sectional states of the silicon oxide layer and the piezoelectric layer of the sample according to Comparative Example 1.

As shown in FIG. 5A, in the silicon oxide layer of the sample according to Example 1, no deteriorated layer was formed at the interface of the silicon oxide layer with the intermediate layer. In contrast, as shown in FIG. 5B, a deteriorated layer was formed in the sample of Comparative Example 1 at the interface of the silicon oxide layer with the piezoelectric layer. Thus, it was confirmed by these results that the intermediate layer provided to the piezoelectric element according to the embodiment can prevent deterioration of the silicon oxide layer at the interface and improve the reliability.

5. Liquid Ejecting Apparatus

Figure 6:
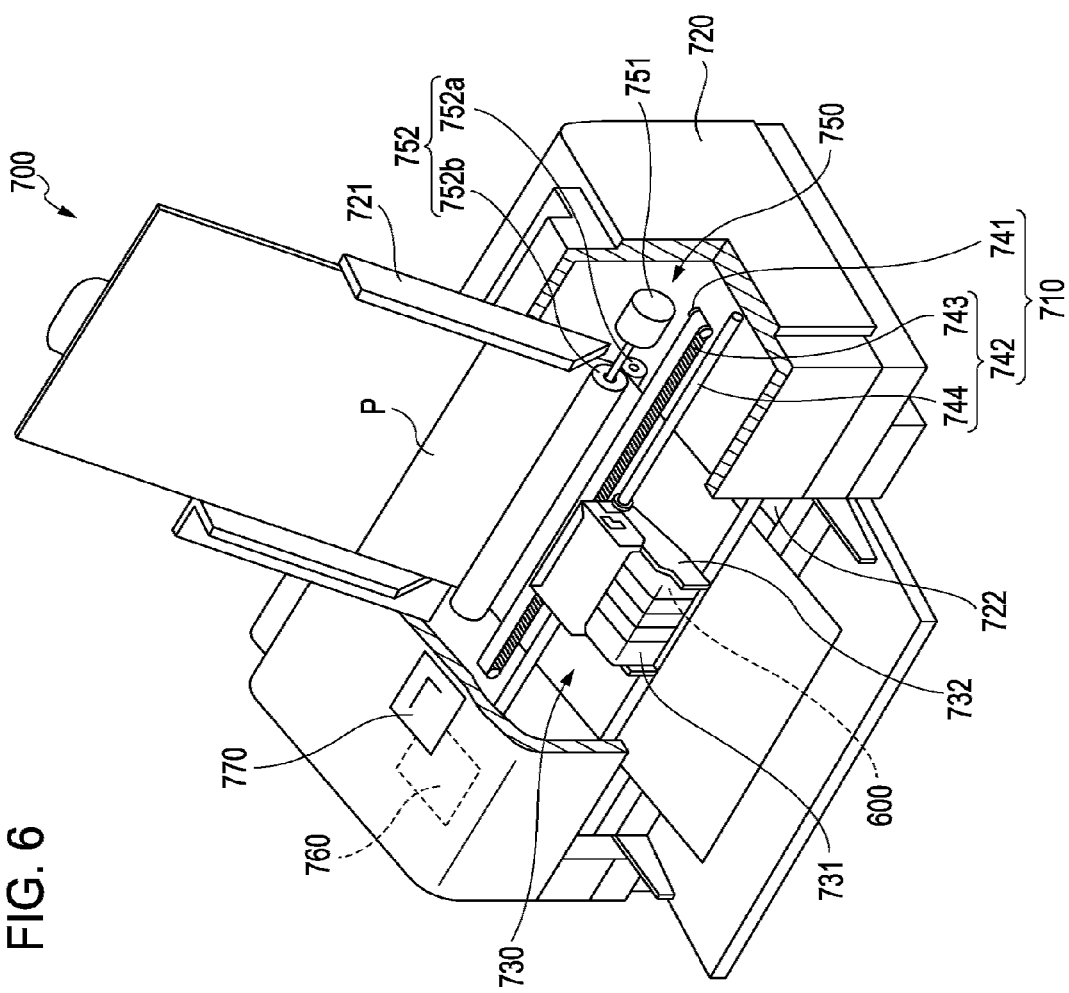
FIG. 6 is a perspective view schematically illustrating a liquid ejecting apparatus according to the embodiment.

Next, a liquid ejecting apparatus according to this embodiment will be described with reference to the drawing. FIG. 6 is a perspective view schematically illustrating a liquid ejecting apparatus 700 according to the embodiment.

The liquid ejecting apparatus 700 includes the liquid ejecting head according to an aspect of the invention. An example using the liquid ejecting head 600 as a liquid ejecting head according to an aspect of the invention will be described below.

As shown in FIG. 6, the liquid ejecting apparatus 700 includes a head unit 730, a driving portion 710, and a controller 760. The liquid ejecting apparatus 700 can further include an apparatus body 720, a paper feeding portion 750, a tray 721 for setting recording paper P, a discharge port 722 for discharging the recording paper P, and an operation panel 770 disposed on the upper surface of the apparatus body 720.

The head unit 730 includes an ink jet recording head (hereinafter, also simply referred to as "head") constituted of the above-described liquid ejecting head 600. The head unit 730 further includes an ink cartridge 731 supplying ink to the head and a transporting portion (carriage) 732 equipped with the head and the ink cartridge 731.

The driving portion 710 can allow the head unit 730 to reciprocate. The driving portion 710 includes a carriage motor 741 serving as a driving source of the head unit 730 and a reciprocation mechanism 742 for letting the head unit 730 reciprocate with the rotation of the carriage motor 741.

The reciprocation mechanism 742 includes a carriage guide shaft 744 supported by a frame (not shown) at both ends and a timing belt 743 extending parallel to the carriage guide shaft 744. The carriage guide shaft 744 supports the carriage 732 in such a manner that the carriage 732 can freely reciprocate. Furthermore, the carriage 732 is fixed to a part of the timing belt 743. The head unit 730 is guided by the carriage guide shaft 744 to reciprocate by means of the timing belt 743 that runs by operation of the carriage motor 741. During this reciprocating movement, ink is appropriately discharged from the head to perform printing on the recording paper P.

In the embodiment, an example of the liquid ejecting apparatus that performs printing with moving both the liquid ejecting head 600 and the recording paper P is shown, but the liquid ejecting apparatus of the invention is not limited thereto as long as the apparatus has a mechanism in which printing on recording paper P is performed by changing the relative position between the liquid ejecting head 600 and the recording paper P. Furthermore, though the embodiment shows an example in which printing is performed on the recording paper P, the recording medium on which printing is performed by the liquid ejecting apparatus of the invention is not limited to paper, and examples of the recording medium include various media, such as cloth, films, and metals, and the constitution can be appropriately modified.

The controller 760 can control the head unit 730, the driving portion 710, and the paper feeding portion 750.

The paper feeding portion 750 can transport the recording paper P to the head unit 730 side from the tray 721. The paper feeding portion 750 includes a paper feeding motor 751 serving as a driving source and paper feeding rollers 752 being rotated by operation of the paper feeding motor 751. The paper feeding rollers 752 are composed of a driven roller 752a and a driving roller 752b that vertically oppose each other with a feeding path of the recording paper P therebetween. The driving roller 752b is connected to the paper feeding motor 751. The paper feeding portion 750 is driven by the controller 760 to transport the recording paper P so as to pass under the head unit 730. The head unit 730, the driving portion 710, the controller 760, and the paper feeding portion 750 are disposed inside the apparatus body 720.

The liquid ejecting apparatus 700 can include a liquid ejecting head 600 having a low environmental load and an improved reliability. Consequently, the liquid ejecting apparatus 700 can be a liquid ejecting apparatus having a low environmental load and an improved reliability.

As described above, while an embodiment according to an aspect of the invention has been described in detail, it would be easily understood by those skilled in the art that various modifications that do not substantially depart from the new matters and effects of the invention can be made. Accordingly, these modifications are all within the scope of the invention.

What is claimed is:

1. A piezoelectric element comprising:
   a silicon oxide layer;
   an intermediate layer provided above the silicon oxide layer;
   a first electrode provided above the intermediate layer;
   a piezoelectric layer provided above the intermediate layer; and
   a second electrode provided above the piezoelectric layer, wherein
      the piezoelectric layer is configured of a complex oxide having a perovskite structure and containing at least bismuth and iron;
      the intermediate layer contains magnesium oxide and/or aluminum oxide,
      the intermediate layer is in contact with the first electrode, and
      movement of the piezoelectric layer deforms the silicon oxide layer and the intermediate layer.

2. The piezoelectric element according to claim 1, wherein the piezoelectric layer is provided on the intermediate layer and the first electrode.

3. The piezoelectric element according to claim 1, wherein the complex oxide further contains manganese and titanium.

4. The piezoelectric element according to claim 3, wherein the complex oxide further contains potassium.

5. A liquid ejecting head comprising the piezoelectric element according to claim 1.

6. A liquid ejecting apparatus comprising the liquid ejecting head according to claim 5.

7. A piezoelectric element comprising:
   a silicon oxide layer;
   an intermediate layer provided above the silicon oxide layer;
   a first electrode provided above the intermediate layer;
   a piezoelectric layer provided above the intermediate layer; and
   a second electrode provided above the piezoelectric layer, wherein
      the piezoelectric layer is configured of a complex oxide having a perovskite structure and containing at least bismuth and iron; and
      the intermediate layer contains magnesium oxide and/or aluminum oxide,
      the intermediate layer is in contact with the first electrode, and
      the thickness of the intermediate layer 10 nm or more and 100 nm or less.

8. The piezoelectric element according to claim 7, wherein the piezoelectric layer is provided on the intermediate layer and the first electrode.

9. The piezoelectric element according to claim 7, wherein the complex oxide further contains manganese and titanium.

* * * * *